United States Patent
Goel et al.

(10) Patent No.: US 10,199,094 B2
(45) Date of Patent: Feb. 5, 2019

(54) WRITE OPERATION SCHEME FOR SRAM

(71) Applicant: ARM Limited, Cambridge (GB)

(72) Inventors: Ankur Goel, Noida (IN); Saikat Kumar Banik, Noida (IN); Lokesh Kumar Saini, New Delhi (IN); Vivek Asthana, Noida (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/619,332

(22) Filed: Jun. 9, 2017

(65) Prior Publication Data
US 2018/0358086 A1    Dec. 13, 2018

(51) Int. Cl.
| G11C 11/412 | (2006.01) |
| G11C 11/419 | (2006.01) |
| H01L 23/528 | (2006.01) |
| H01L 27/11 | (2006.01) |
| G11C 11/418 | (2006.01) |

(52) U.S. Cl.
CPC .......... *G11C 11/419* (2013.01); *G11C 11/418* (2013.01); *H01L 23/528* (2013.01); *H01L 27/1104* (2013.01)

(58) Field of Classification Search
CPC .......... G11C 7/12; G11C 11/4094; G11C 7/22
USPC ............................................ 365/203
See application file for complete search history.

(56) References Cited

U.S. PATENT DOCUMENTS

| 5,777,935 A * | 7/1998 | Pantelakis | G11C 7/12 365/202 |
| 8,345,470 B2 * | 1/2013 | Satomi | G11C 11/418 365/154 |
| 8,488,401 B2 * | 7/2013 | Sasaki | G11C 11/419 365/203 |
| 8,837,205 B2 * | 9/2014 | Pelley | G11C 11/413 365/154 |
| 9,754,645 B2 * | 9/2017 | Amarnath | G11C 7/12 |

* cited by examiner

*Primary Examiner* — Hoai V Ho
*Assistant Examiner* — Minh Dinh
(74) *Attorney, Agent, or Firm* — Pramudji Law Group PLLC; Ari Pramudji

(57) ABSTRACT

A circuit includes a memory cell with a bitline. A pulldown nMOSFET has a gate terminal connected to an output port of a logic gate, and a drain terminal connected to the first bitline. A write select line is connected to a second input port of the logic gate. A pullup pMOSFET has a gate terminal connected to the write select line, and a drain terminal connected to the bitline.

20 Claims, 3 Drawing Sheets

WRITE OPERATION SCHEME FOR SRAM

BACKGROUND

For SRAM (Static Random Access Memory) circuits, write operations are more prone to errors at a SF (Slow-Fast) process point, due in part to pull-up pMOSFETs (Metal Oxide Semiconductor Field Effect Transistor) being much stronger than pass n-MOSFETs. A design goal for an SRAM is to qualify the SF process point when margining. For an SRAM with low supply voltage, there can be increased weakness in driving the bitlines during a write operation. This weakness can be further exacerbated with increasing interconnect length and loading. In particular, a driver may not pull a bitline fully to a logical LOW (e.g., Vss or ground voltage). This problem may worsen in an SRAM as the mux configuration is increased, where the write driver outputs are routed over longer distances to drive the column interconnects, thereby resulting in a larger RC (resistance-capacitance product) interconnect load.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit implementations of various techniques described herein.

DETAILED DESCRIPTION

In the description that follows, the scope of the term "some implementations" is not to be so limited as to mean more than one implementation, but rather, the scope may include one implementation, more than one implementation, or perhaps all implementations.

Various implementations described herein improve SRAM write operation margin at an SF process point by mitigating the effects of RC interconnect, so that a bitline may be pulled down fully to a logical LOW voltage value during a write operation.

Figure 1:
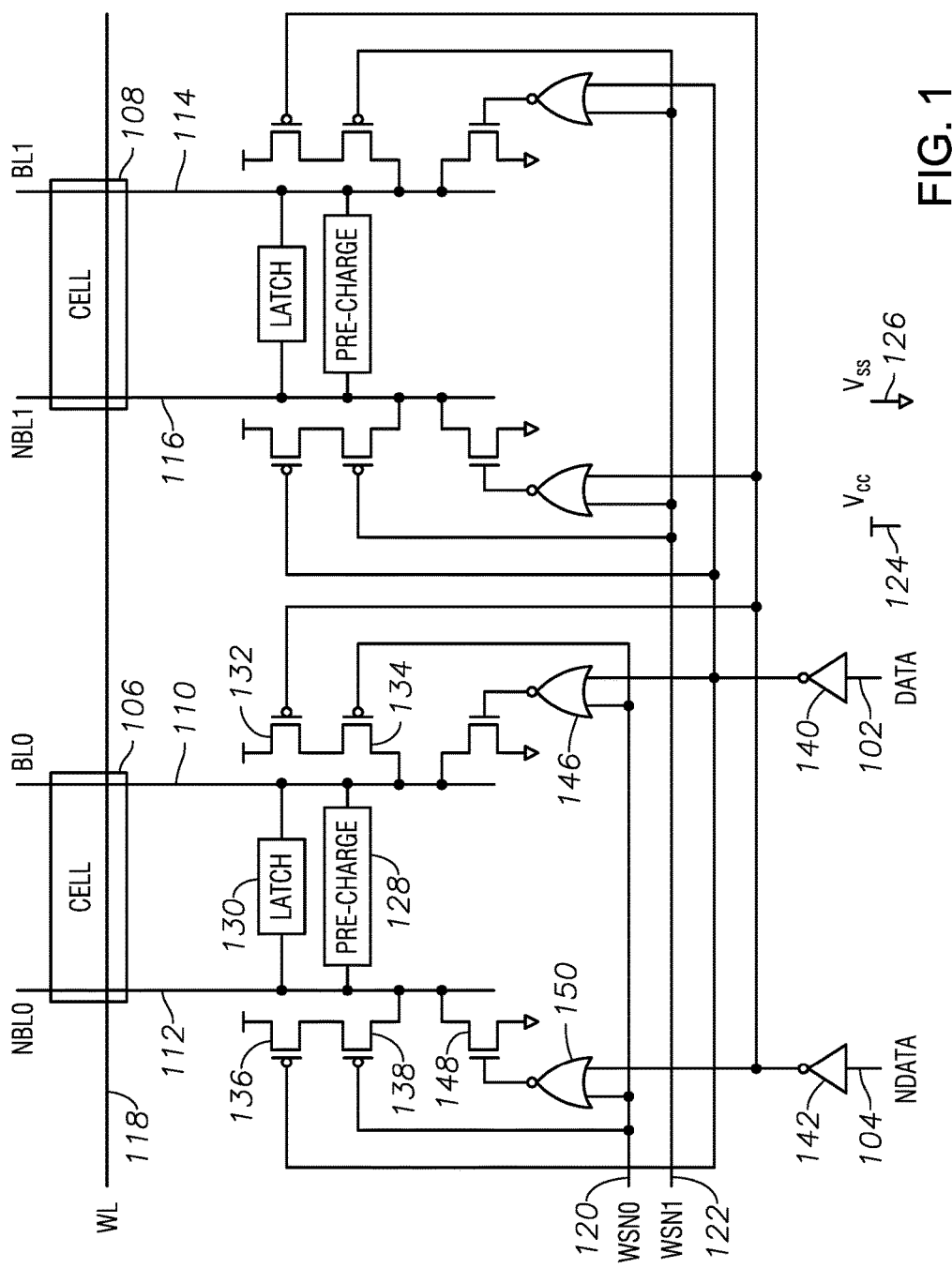
FIG. 1 illustrates an SRAM in accordance with various implementations described herein.

FIG. 1 illustrates a portion of an SRAM, where for ease of illustration only one pair of write data input ports, labeled 102 and 104, and only two memory cells, labeled 106 and 108, are explicitly shown. The input data to an input port 102 is labeled "DATA" and the input data to an input port 104 is labeled "NDATA" to indicate that NDATA is the logical complement of DATA. Associated with the memory cell 106 is a pair of bitlines 110 and 112, denoted as "BL0" and "NBL0", respectively. Associated with the memory cell 108 is a pair of bitlines 114 and 115, denoted as "BL1" and "NBL1", respectively. As in a conventional SRAM, the signals on the bitlines BL0 and NBL0 at the completion of a read or write operation may be described as a logically complementary pair, and similarly, at the completion of a read or write operation the signals on the bitlines BL1 and NBL1 are a logically complementary pair. Associated with the memory cells 106 and 108 is a wordline 118.

In practice, an SRAM would likely include write data input pairs equal in number to a word length, and with bitline pairs and memory cells much greater in number than that illustrated in FIG. 1. The implementation of FIG. 1 is a MUX-2 configuration, where a write select line 120 is de-asserted LOW for a write operation on the memory cell 106, and a write select line 122 is de-asserted LOW for a write operation on the memory cell 108. The write select lines 120 and 122 are asserted HIGH otherwise. Conventional meanings may be given to the voltages HIGH or LOW, for example where HIGH denotes a voltage indicative of a supply voltage Vcc associated with a supply rail 124, and LOW denotes a voltage indicative of a ground or substrate 126 (at voltage Vss).

As in a conventional SRAM, associated with each bitline pair is a pre-charge circuit and a latch circuit, where before a read operation is performed, a pre-charge circuit pulls HIGH its associated bitline pair, and at the end of a read operation, a latch circuit latches the signals on its associated bitline pair. For example, associated with the bitline pair 110 and 112 is a pre-charge circuit 128 and a latch circuit 130.

Connected to the bitline 110 is a serially connected pair of pullup pMOSFETs 132 and 134, where the source terminal of the pullup pMOSFET 132 is connected to the supply rail 124 and the drain terminal of the pullup pMOSFET 134 is connected to the bitline 110. Similarly, a serially connected pair of pullup pMOSFETs 136 and 138 is connected to the bitline 112, where the source terminal of the pullup pMOSFET 136 is connected to the supply rail 124 and the drain terminal of the pullup pMOSFET 138 is connected to the bitline 112.

The gates of the pullup pMOSFETs 134 and 138 are each connected to the write select line 120. The gate terminal of the pullup pMOSFET 136 is connected to the output port of a write driver 140, and the gate terminal of the pullup pMOSFET 132 is connected to the output port of a write driver 142. The input port of the write driver 140 is the input port 102 (DATA), and the input port of the write driver 142 is the input port 104 (NDATA). In the particular implementation of FIG. 1, inverters are used for the write drivers 140 and 142.

A pulldown nMOSFET 144 has its drain terminal connected to the bitline 110 and its source terminal connected to the ground or substrate 126. The gate terminal of the pulldown nMOSFET 144 is connected to the output port of a NOR gate 146. A first input port of the NOR gate 146 is connected to the output port of the write driver 140, and a second input port of the NOR gate 146 is connected to the write select line 120. Similarly, a pulldown nMOSFET 148 has its drain terminal connected to the bitline 112 and its source terminal connected to the ground or substrate 126. The gate terminal of the pulldown nMOSFET 148 is connected to the output port of a NOR gate 150. A first input port of the NOR gate 150 is connected to the output port of the write driver 142, and a second input port of the NOR gate 150 is connected to the write select line 120.

Various pullup pMOSFETs, pulldown nMOSFETs, and NOR gates associated with the bitline pair 114 and 116 are illustrated in FIG. 1, and have as their counterparts the various circuit components associated with the bitline pair 110 and 112 as discussed above. The circuit components associated with the bitline pair 114 and 116 function in the same way as their counterparts, where the memory cell 108 associated with the bitline pair 114 and 116 is accessed for a write operation by de-asserting LOW the write select line 122. Accordingly, a detailed description of the circuit components associated with the bitline pair 114 and 116 need not be elaborated, and the following description of the implementation of FIG. 1 will pertain to the bitline pair 110 and 112 and its associated circuit components.

When a write operation is not being performed, the write select line 120 is asserted HIGH, in which case the output ports of the NOR gates 146 and 150 are each LOW to switch OFF the pulldown nMOSFETs 144 and 148. Furthermore, when the write select line 120 is asserted HIGH, the gates of the pullup pMOSFETs 134 and 138 are each HIGH so that these pullup pMOSFETs are OFF. Therefore, when a write operation is not being performed, the data at the write input ports 102 and 104 do not affect the bitline pair 110 and 112.

Now consider the case in which a write operation is being performed on the memory cell 106 associated with the bitline pair 110 and 112. The write select line 120 is de-asserted LOW, in which case the pullup pMOSFETs 134 and 138 are each switched ON. Furthermore, when the write select line 120 is de-asserted LOW, the states of the write drivers 140 and 142 determine the states of the NOR gates 146 and 150. Without loss of generality, suppose DATA is LOW (the input port to the write driver 140 is LOW) so that the output port of the write driver 140 is HIGH. When DATA is LOW, NDATA is HIGH (the input port to the write driver 142 is HIGH), and the output port of the write driver 142 is LOW. In this scenario, the output port of the NOR gate 146 is LOW to switch OFF the pulldown nMOSFET 144, and the output port of the NOR gate 150 is HIGH to switch ON the pulldown nMOSFET 148.

Continuing with the above example of a write operation in which DATA is LOW and NDATA is HIGH, the write driver 140 switches OFF the pullup pMOSFET 136, and the write driver 142 switches ON the pullup pMOSFET 132. With both pMOSFETs 132 and 134 ON (the pullup pMOSFET 134 is ON because the write select line 120 is de-asserted LOW) and the pulldown nMOSFET 144 OFF, the bitline 110 is pulled HIGH. Furthermore, because the pulldown nMOSFET 148 is ON and the write driver 140 switches OFF the pullup pMOSFET 136, the bitline 112 is pulled LOW. In this way, data is written to the memory cell 106 so that the state of the memory cell 106 reflects the data at the input ports 102 and 104. At the completion of the write operation to the memory cell 106, the write select line 120 is asserted HIGH.

The output ports of the write drivers in an SRAM according to the implementation of FIG. 1 experience a smaller load (less RC) than in a conventional SRAM. In the implementation of FIG. 1, the write drivers 140 and 142 need only drive the input ports of the NOR gates, the gate terminals of pullup pMOSFETs, and the interconnects thereto. There is no requirement that the write drivers pull down various bitlines LOW during a write operation. This reduction in the RC load on the output ports of the write drivers can be important in low voltage applications.

Figure 2:
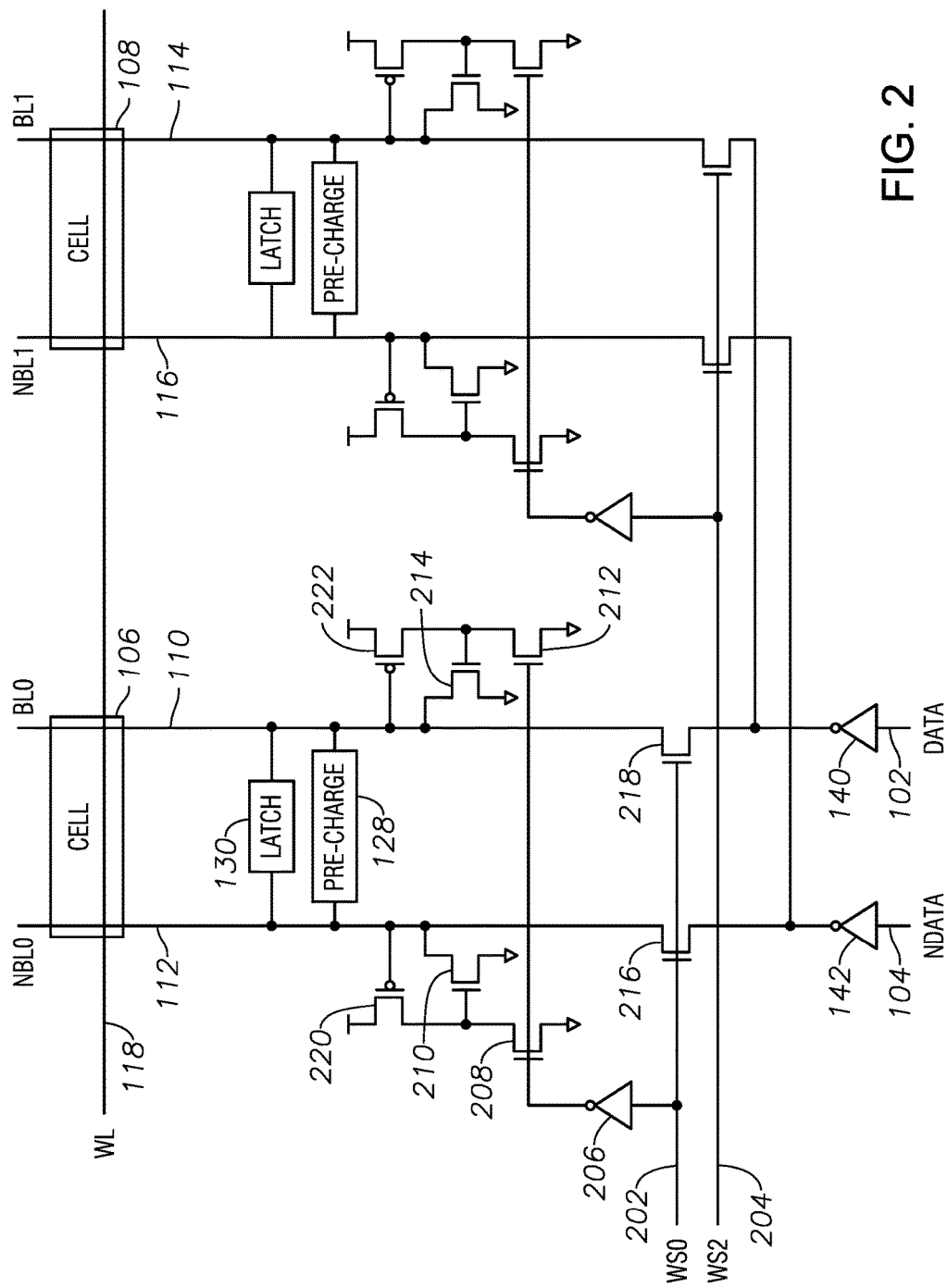
FIG. 2 illustrates another SRAM in accordance with various implementations described herein.

FIG. 2 illustrates another SRAM implementation, where circuit components in FIG. 2 and their corresponding counterparts in FIG. 1 share the same labels. In FIG. 2, a write select line 202 (labeled "WS0") is asserted HIGH when a write operation is being performed on the memory cell 106, and a write select line 204 (labeled "WS1") is asserted HIGH when a write operation is being performed on the memory cell 108. The write select lines 202 and 204 are de-asserted LOW otherwise. As discussed with respect to the implementation of FIG. 1, it is sufficient when describing the implementation of FIG. 2 to consider operations performed on the memory cell 106.

When no write operation is being performed, the write select signal 202 is LOW to cause an inverter 206 to drive HIGH the gate terminal of a pulldown nMOSFET 208. With the gate terminal of the pulldown nMOSFET 208 held HIGH, a pulldown nMOSFET 210 is kept OFF. Similarly, the inverter 206 drives HIGH the gate terminal of a pulldown nMOSFET 212 so that a pulldown nMOSFET 214 is kept OFF.

Pass nMOSFETs 216 and 218 have their respective gate terminals connected to the write select line 202, where a source/drain terminal of the nMOSFET 216 is connected to the bitline 112 and a source/drain terminal of the nMOSFET 218 is connected to the bitline 110. When a write operation is being performed on the memory cell 106, the write select signal 202 is HIGH, in which case pass nMOSFETs 216 and 218 are ON to couple the output ports of the write drivers 140 and 142 to their respective bitlines. The pass nMOSFETs 216 and 218 may also be referred to as MUX nMOSFETs. In some implementations, transmission gates or pMOSFETs may be used in place of the pass nMOSFETs 216 and 218, so that the pass nMOSFETs 216 and 218 may more generally be referred to as pass transistors.

As for the implementation of FIG. 1, in describing a write operation for the implementation of FIG. 2, without loss of generality, DATA is assumed to be LOW and NDATA is assumed to be HIGH so that the output port of the write driver 140 is HIGH and the output port of the write driver 142 is LOW. When the write select signal 202 is HIGH, the inverter 206 keeps OFF the pulldown nMOSFETs 208 and 212 so that the states of pullup pMOSFETs 220 and 220 determine the states of the pulldown nMOSFETs 210 and 214, respectively. Specifically, when the pullup pMOSFET 220 is ON, the pulldown nMOSFET 210 is switched ON, and when the pullup pMOSFET 222 is ON, the pulldown nMOSFET 214 is switched ON.

Under the assumption that DATA is LOW and NDATA is HIGH, the write driver 140 pulls the bitline 110 toward HIGH, and the write driver 142 pulls the bitline 112 towards LOW. As the bitline 112 is pulled LOW, the pullup pMOSFET 220 starts to turn ON, causing the pulldown nMOSFET 210 to turn ON and pull down the bitline 110 to LOW. The pulldown nMOSFET 210 assists the write driver 142 in pulling LOW the bitline 112, thereby improving write operations in an SF corner.

In the above circuit descriptions, it should be appreciated that whether a signal is LOW or HIGH to achieve some desired result depends upon the particular choice of logic gates. Other implementations are readily realized with logic configurations other than that shown in the implementations of FIG. 1 or FIG. 2. As an example, inverters may be used in FIG. 1 with the write select lines 120 and 122, so that these write select lines should be asserted HIGH for a write operation on their corresponding memory cells, and de-asserted LOW otherwise. In other implementations, logic gates other than the NOR gates shown in FIG. 1 may be used. As another example, in FIG. 2, buffers may be used in place of inverters, such as for example the inverter 206, where the write select line 202 is de-asserted LOW when performing a write operation on the memory cell 106.

Figure 3:
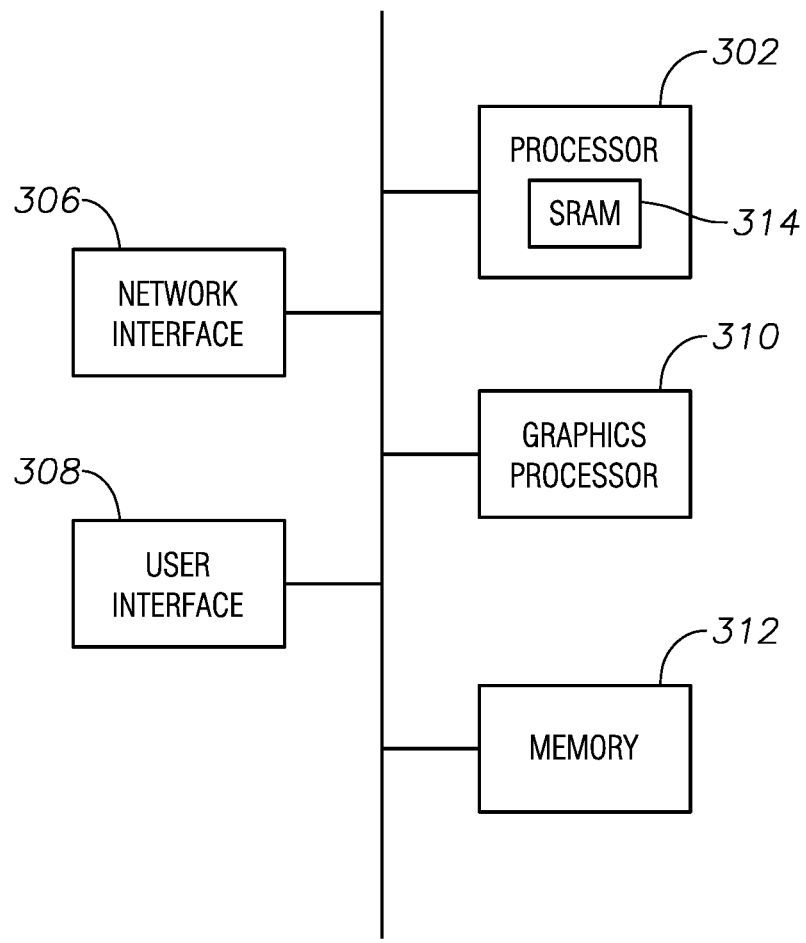
FIG. 3 illustrates an application of an SRAM in accordance with various implementations described herein

For ease of illustration, the implementations in FIG. 1 and FIG. 2 do not illustrate all components in a typical SRAM, such as for example an address decoder, a controller to perform read and write operations, etc. In some applications, the SRAM of FIG. 1 or FIG. 2 may be integrated with other functional units in a processor or a SoC (System-on-Chip). For example, FIG. 3 illustrates a processor 302 coupled by way of an interconnect or bus 304 to various other functional units, such as a network interface 306, a user interface 308, a graphics processor 310, and a system memory 312. The processor 302 represents one or more processors, were each processor comprises one or more processor cores.

The system memory 312 may be part of a memory hierarchy, or some components of the memory hierarchy may be embedded on the same chip as the processor 302. For example, shown in FIG. 3 is an SRAM 314 that may include the implementation of FIG. 1 or FIG. 2. The SRAM 314 may store instructions or data according to one or more programs running on the processor 302.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

Further, the discussion provided herein may be considered directed to certain specific implementations. It should be understood that the discussion provided herein is provided for the purpose of enabling a person with ordinary skill in the art to make and use any subject matter defined herein by the subject matter of the claims. It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a circuit, where the implementation includes a first memory cell, a first bitline connected to the first memory cell, and a first logic gate having a first input port, a second input port, and an output port. The implementation further includes a first pulldown nMOSFET having a gate terminal connected to the output port of the first logic gate, and a drain terminal connected to the first bitline. The implementation further includes a first write select line connected to the second input port of the first logic gate, and a first pullup pMOSFET having a gate terminal connected to the first write select line, a drain terminal connected to the first bitline, and a source terminal.

Described herein are various implementations of a circuit, where the implementation includes a first memory cell, a first bitline connected to the first memory cell, a first write select line, a first write driver having an output port, and a first pass transistor having a gate terminal connected to the first write select line, a first terminal connected to the first bitline, and a second terminal connected to the output port of the first write driver. The implementation further includes a first logic gate having an input port connected to the first write select line, and an output port. The implementation further includes a first pulldown nMOSFET having a gate terminal connected to the output port of the first logic gate, and a drain terminal. The implementation further includes a second pulldown nMOSFET having a gate terminal connected to the drain terminal of the first pulldown nMOSFET, and a drain terminal connected to the first bitline.

Described herein are various implementations of a circuit, where the implementation includes a memory cell, a bitline connected to the memory cell, a write select line, a pulldown nMOSFET coupled to the bitline, a write driver, and a logic gate coupled to the write driver, the write select line, and the pulldown nMOSFET. In the implementation, the logic gate is configured to cause the pulldown nMOSFET to pull the bitline LOW in response to the write driver when the write select line is at a first logic value, and to turn OFF the pulldown nMOSFET when the write select line is at a second logic value complementary to the first logic value.

Reference has been made in detail to various implementations, examples of which are illustrated in the accompanying drawings and figures. Numerous specific details are set forth to provide a thorough understanding of the disclosure provided herein. However, the disclosure provided herein may be practiced without these specific details. In some other instances, well-known methods, procedures, components, circuits, and networks have not been described in detail so as not to unnecessarily obscure details of the implementations.

If one or more circuits are used to realize some or all instances of an implementation, reference may be made to a node or terminal of a circuit or circuit element as an input port or an output port. For a circuit in which a port is a two terminal structure (e.g., circuits modeled as lumped-parameter systems), a recited node or terminal forms one terminal of the two terminal structure, where it is understood that a ground rail (or substrate) serves as another terminal of the two terminal structure.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting

[the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described herein are disclosed as example forms of implementing the claims.

What is claimed is:

1. A circuit comprising:
a first memory cell;
a first bitline connected to the first memory cell;
a second bitline connected to the first memory cell;
a first logic gate having a first input port, a second input port, and an output port;
a first pulldown nMOSFET having a gate terminal connected to the output port of the first logic gate, and a drain terminal coupled connected to the first bitline;
a first write select line connected to the second input port of the first logic gate;
a first pullup pMOSFET having a gate terminal connected to the first write select line, a drain terminal connected to the first bitline, and a source terminal;
a second pullup pMOSFET having a gate terminal, and a drain terminal connected to the source terminal of the first pullup pMOSFET;
a second logic gate having a first input port connected to the gate terminal of the second pullup pMOSFET, a second input port connected to the first write-select line, and an output port; and
a second pulldown nMOSFET having a gate terminal connected to the output port of the second logic gate, and a drain terminal connected to the second bitline.

2. The circuit as set forth in claim 1, wherein the first logic gate is a first NOR gate.

3. The circuit as set forth in claim 1, wherein the first logic gate is a first NOR gate and the second logic gate is a second NOR gate.

4. The circuit as set forth in claim 1, further comprising:
a third pullup pMOSFET having a gate terminal connected to the first write select line, a drain terminal connected to the second bitline, and a source terminal; and
a fourth pullup pMOSFET having a gate terminal connected to the first input port of the first logic gate, and a drain terminal connected to the source terminal of the third pullup pMOSFET.

5. The circuit as set forth in claim 4, wherein the first memory cell is an SRAM cell.

6. The circuit as set forth in claim 5, further comprising:
a first write driver having an output port connected to the first input port of the first logic gate, and an input port; and a second write driver having an output port connected to the first input port of the second logic gate, and an input port.

7. The circuit as set forth in claim 6, wherein the input port of the first write driver is configured to receive input data that is the logical complement of input data provided to the input port of the second write driver.

8. The circuit as set forth in claim 4, further comprising:
a latch connected to the first and second bitlines; and
a pre-charge circuit connected to the first and second bitlines.

9. The circuit as set forth in claim 4, further comprising:
a second memory cell;
a third bitline connected to the second memory cell;
a second write select line;
a third logic gate having a first input port connected to the first input port of the first logic gate, a second input port connected to the second write select line, and an output port;
a third pulldown nMOSFET having a gate terminal connected to the output port of the third logic gate, and a drain terminal connected to the third bitline;
a fifth pullup pMOSFET having a gate terminal connected to the second write select line, a drain terminal connected to the third bitline, and a source terminal; and
a sixth pullup pMOSFET having a gate terminal connected to the first input port of the second logic gate, and a drain terminal connected to the source terminal of the fifth pullup pMOSFET.

10. The circuit as set forth in claim 9, further comprising:
a fourth bitline connected to the second memory cell;
a fourth logic gate having a first input port connected to the first input port of the second logic gate, a second input port connected to the second write select line, and an output port;
a fourth pulldown nMOSFET having a gate terminal connected to the output port of the fourth logic gate, and a drain terminal connected to the fourth bitline;
a seventh pullup pMOSFET having a gate terminal connected to the second write select line, a drain terminal connected to the fourth bitline, and a source terminal; and
an eighth pullup pMOSFET having a gate terminal connected to the first input port of the third logic gate, and a drain terminal connected to the source terminal of the seventh pullup pMOSFET.

11. A circuit comprising:
a first memory cell;
a first bitline connected to the first memory cell;
a first write select line;
a first write driver having an output port;
a first pass transistor having a gate terminal connected to the first write select line, a first terminal connected to the first bitline, and a second terminal connected to the output port of the first write driver;
a first logic gate having an input port connected to the first write select line, and an output port;
a first pulldown nMOSFET having a gate terminal connected to the output port of the first logic gate, and a drain terminal; and
a second pulldown nMOSFET having a gate terminal connected to the drain terminal of the first pulldown nMOSFET, and a drain terminal connected to the first bitline.

12. The circuit as set forth in claim 11, wherein the first logic gate is an inverter.

13. The circuit as set forth in claim 11, further comprising:

a first pullup pMOSFET having a drain terminal connected to the drain terminal of the first pulldown nMOSFET, and a gate terminal connected to the first bitline.

14. The circuit as set forth in claim 13, further comprising:

a second bitline connected to the first memory cell;

a second write driver having an output port;

a second pass transistor having a gate terminal connected to the first write select line, a first terminal connected to the second bitline, and a second terminal connected to the output port of the second write driver;

a third pulldown nMOSFET having a gate terminal connected to the output port of the first logic gate, and a drain terminal; and a fourth pulldown nMOSFET having a gate terminal connected to the drain terminal of the third pulldown nMOSFET, and a drain terminal connected to the second bitline.

15. The circuit as set forth in claim 14, further comprising:

a second pullup pMOSFET having a drain terminal connected to the drain terminal of the third pulldown nMOSFET, and a gate terminal connected to the second bitline.

16. The circuit as set forth in claim 15, wherein the first logic gate is an inverter.

17. The circuit as set forth in claim 16, further comprising:

a second memory cell;

a third bitline connected to the second memory cell;

a second write select line;

a third pass transistor having a gate terminal connected to the second write select line, a first terminal connected to the third bitline, and a second terminal connected to the output port of the first write driver;

a second logic gate having an input port connected to the second write select line, and an output port;

a fifth pulldown nMOSFET having a gate terminal connected to the output port of the second logic gate, and a drain terminal;

a sixth pulldown nMOSFET having a gate terminal connected to the drain terminal of the fifth pulldown nMOSFET, and a drain terminal connected to the third bitline; and a third pullup pMOSFET having a drain terminal connected to the drain terminal of the fifth pulldown nMOSFET, and a gate terminal connected to the third bitline.

18. A circuit comprising:

a memory cell;

a bitline connected to the memory cell;

a write select line;

a pulldown nMOSFET directly coupled to the bitline, wherein a drain terminal of the pulldown nMOSFET is directly coupled to the bitline, and a gate terminal of the pulldown nMOSFET is directly coupled to a drain terminal of a second pulldown NMOSFET;

a write driver;

a logic gate coupled to the write driver, the write select line, and the pulldown nMOSFET, wherein the logic gate is configured to cause the pulldown nMOSFET to pull the bitline LOW in response to the write driver when the write select line is at a first logic value, and to turn OFF the pulldown nMOSFET when the write select line is at a second logic value complementary to the first logic value; and the second pulldown nMOSFET having a gate terminal directly coupled to an output of the logic gate, and the drain terminal of the second pulldown nMOSFET directly coupled to the gate terminal of the pulldown nMOSFET.

19. The circuit of claim 18, wherein the logic gate is a NOR gate.

20. The circuit of claim 18, further comprising:

a pass transistor having a gate terminal connected to the write select line, a drain terminal connected to the bitline, and a source terminal connected to an output port of the write driver.

* * * * *